(12) United States Patent
Lin (10) Patent No.: US 8,487,195 B2
(45) Date of Patent: Jul. 16, 2013

(54) VIA STRUCTURE FOR MULTI-GIGAHERTZ SIGNALING

(75) Inventor: Shengli Lin, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 458 days.

(21) Appl. No.: 12/717,570

(22) Filed: Mar. 4, 2010

(65) Prior Publication Data

US 2011/0214912 A1    Sep. 8, 2011

(51) Int. Cl.
*H05K 1/11* (2006.01)
(52) U.S. Cl.
USPC .......................................... 174/262; 174/255
(58) Field of Classification Search
None
See application file for complete search history.

(56) References Cited

U.S. PATENT DOCUMENTS

| | | | |
|---|---|---|---|
| 6,538,538 B2 * | 3/2003 | Hreish et al. | 333/246 |
| 6,710,258 B2 * | 3/2004 | Oggioni et al. | 174/255 |
| 7,897,880 B1 * | 3/2011 | Goergen et al. | 174/262 |
| 8,143,976 B2 * | 3/2012 | Wyland | 333/260 |
| 2006/0060376 A1 | 3/2006 | Yoon | |

FOREIGN PATENT DOCUMENTS

| | | |
|---|---|---|
| GB | 2 404 092 A | 1/2005 |
| WO | WO 2011/053396 A1 | 5/2011 |

OTHER PUBLICATIONS

International Search Report for European Patent Application 11001349.7-1232 dated May 25, 2011. 64 pages.

* cited by examiner

*Primary Examiner* — Ishwarbhai Patel
(74) *Attorney, Agent, or Firm* — Sterne, Kessler, Goldstein & Fox PLLC (57) ABSTRACT

A via structure is disclosed to pass electronic signals from a first conductive pathway formed on a first outermost substrate of a multi-layer PCB to a second conductive pathway formed on a second outermost substrate of the multi-layer PCB. The via structure allows the electronic signals to pass from the first outermost substrate through one or more inner substrates to the second outermost substrate. The one or more inner substrates include one or more closed geometric structures to enclose the via structure.

17 Claims, 11 Drawing Sheets

VIA STRUCTURE FOR MULTI-GIGAHERTZ SIGNALING

FIELD OF THE INVENTION

The present invention relates generally to a print circuit board (PCB) design and manufacturing and specifically to a via structure of the PCB.

BACKGROUND

A printed circuit board (PCB) is used to mechanically support and electrically connect electronic components using conductive pathways laminated onto a substrate. Several substrates, each with their own conductive pathways, may be bonded together to form a conventional multi-layer PCB. The conductive pathways formed onto one substrate may be connected to the conductive pathways formed onto other substrates using via structures. Holes are typically drilled from one substrate to another substrate then filled and/or plated with conductive material to foam the conventional via structure.

Electronic components are typically mounted on both sides of the conventional multi-layer PCB. Electronic signals traveling from a first electronic component mounted on a first substrate of the conventional multi-layer PCB may travel through the conventional via structure to reach a second electric component mount on a second substrate. The electronic signals travel through a first conductive pathway formed on the first substrate through the conventional via structure to a second conductive pathway formed on the second substrate. The conventional via structure attenuates power levels of the electronic signals passing from the first conductive pathway to the second conductive pathway and also reflects some of these signals back through the first conductive pathway. The reflection of the electronic signals back through the first conductive pathway is detrimental to the performance of the electronic circuit formed on the conventional multi-layer PCB.

Typically, conductive pathways routing the electronic signals at higher frequencies were limited to a single conductive substrate of the conventional multi-layer PCB. However, the conventional multi-layer PCB is becoming smaller in size requiring more than one substrate to connect electronic components. The conventional multi-layer PCB may have hundreds, thousands, and even tens of thousands of vias to route the electronic signals between the substrates of the conventional multi-layer PCB.

Thus, there is a need for a via structure to optimize passing of electronic signals from a first conductive pathway formed on a first substrate of a multi-layer PCB to a second conductive pathway formed on a second substrate of the multi-layer PCB that overcomes the shortcomings described above. Further aspects and advantages of the present invention will become apparent from the detailed description that follows.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Conventional Multi-Layer Printed Circuit Board

Figure 1A:
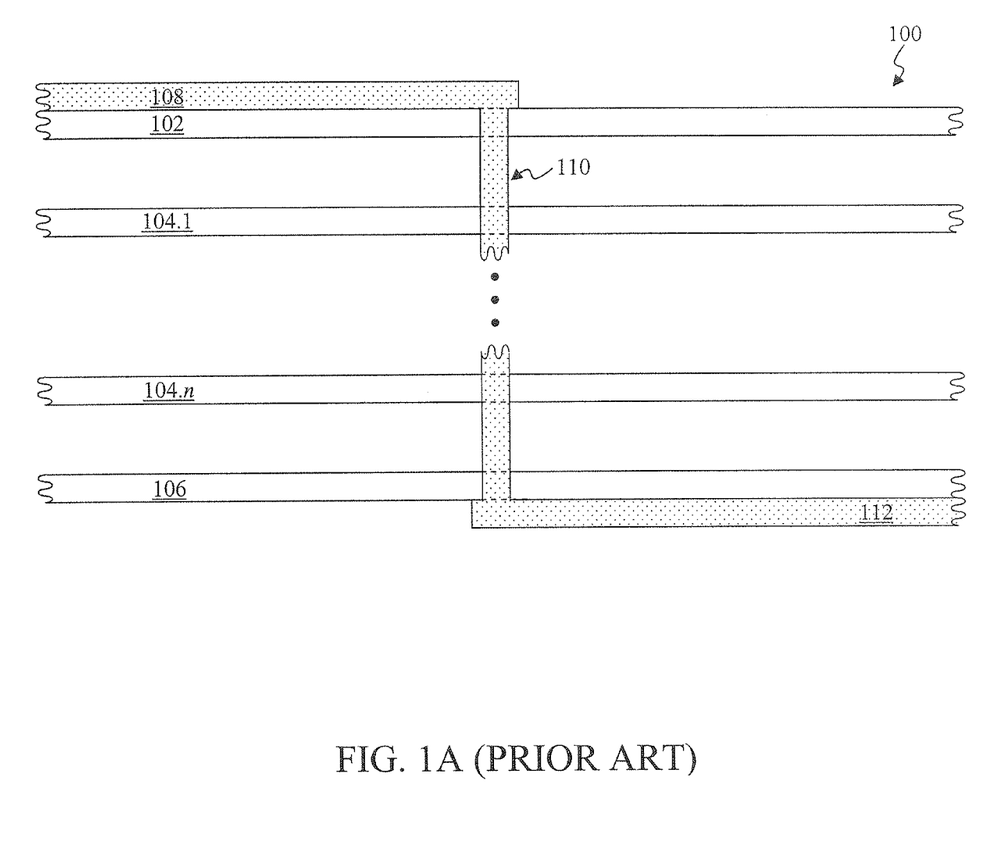
FIG. 1A illustrates a conventional multi-layer printed circuit board.

FIG. 1A illustrates a conventional multi-layer printed circuit board. A printed circuit board (PCB) is used to mechanically support and electrically connect electronic components using conductive pathways laminated onto a substrate, such as a paper PCB substrate such as FR-2, a fiberglass PCB substrate, such as FR-4, a Radio Frequency (RF) PCB substrate, a Flex-Flexible PCB substrate, a Ceramic/Metal Core PCB substrate to provide some examples. Conductive material, such as copper to provide an example, is typically bonded over one or both sides of the substrate. Unwanted portions of the conductive material are then removed to form the conductive pathways. These subtractive methods of removing copper may include silk screen printing, photoengraving, and/or PCB milling to provide some examples. Alternatively, the conductive pathways themselves may be directly added to the substrate using one or more electroplating steps to form the conductive pathways.

Several substrates 102 through 106, each with their own conductive pathways, may be bonded together, typically with an epoxy resin prepreg, to form a conventional multi-layer PCB 100. The conventional multi-layer PCB 100 may include any number of substrates 104.1 through 104.$n$, also referred to as inner substrates, or it may not include any of the substrates 104.1 through 104.$n$. The conductive pathways foamed onto one substrate may be connected to the conductive pathways formed onto other substrates using via structures. Holes are typically drilled from one substrate to another substrate then filled and/or plated with conductive material to form the via structure. For example, a conductive pathway 108 may be connected to a conductive pathway 112 by drilling a hole through the substrates 102 through 106 then plating the hole with copper, or any other suitable metal, to form a conventional via structure 110.

Conventional Via Structure Used in the Conventional Multi-Layer PCB

Figure 1B:
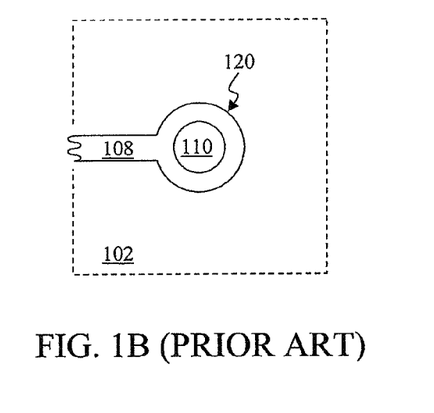
FIG. 1B illustrates a top view of a first outer substrate used in the conventional multi-layer printed circuit board.

FIG. 1B illustrates a top view of a first outer substrate used in the conventional multi-layer printed circuit board. More specifically, FIG. 1B illustrates a portion of the substrate 102 having the conductive pathway 108. A hole is typically drilled from the substrate 102 to the substrate 108 then filled and/or plated with the conductive material to form the conventional via structure 110. Typically, the drill used to form this hole is larger than a width of the conductive pathway 108. The conductive pathway 108 includes a circular ring of conductive material, referred to as a pad 120, to allow for safe drilling of the hole from the substrate 102 to the substrate 108. The pad 120 typically is characterized by a radial distance that is greater than the hole that is drilled for the conventional via structure 110.

Figure 1C:
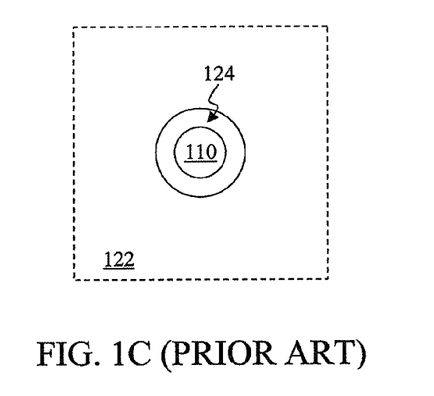
FIG. 1C illustrates a top view of an inner substrate used in the conventional multi-layer printed circuit board.

FIG. 1C illustrates a top view of an inner substrate used in the conventional multi-layer printed circuit board. More specifically, FIG. 1C illustrates a substrate 122 that represents a portion of one or more of the substrates 104.1 through 104.$n$. The substrate 122 includes the hole that is filled and/or plated to form the conventional via structure 110. The substrate 122 includes an isolation region 124 that prevents the conventional via structure 110 from contacting the conductive pathways of the substrate 122. The isolation region 124 represents a circular ring of the substrate 104 that is free from conductive pathways. Alternatively, removal of the isolation region 124 from the substrate 104 may allow the conventional via structure 110 to connect to the conductive pathways of the substrate 122.

Figure 1D:
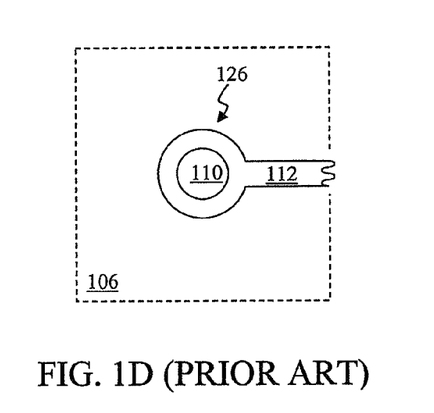
FIG. 1D illustrates a top view of a second outer substrate used in the conventional multi-layer printed circuit board.

FIG. 1D illustrates a bottom view of a second outer substrate used in the conventional multi-layer printed circuit board. More specifically, FIG. 1D illustrates a portion of the substrate 106 having the conductive pathway 112. A hole is typically drilled from the substrate 102 to the substrate 106 then filled and/or plated with the conductive material to form the conventional via structure 110. Typically, the drill used to form this hole is larger than a width of the conductive pathway 112. The conductive pathway 112 includes a circular ring of conductive material, referred to as a pad 126, to allow for safe drilling of the hole from the substrate 102 to the substrate 106. The pad 126 typically has a radial distance that is greater than the hole that is drilled for the conventional via structure 110.

Figure 1E:
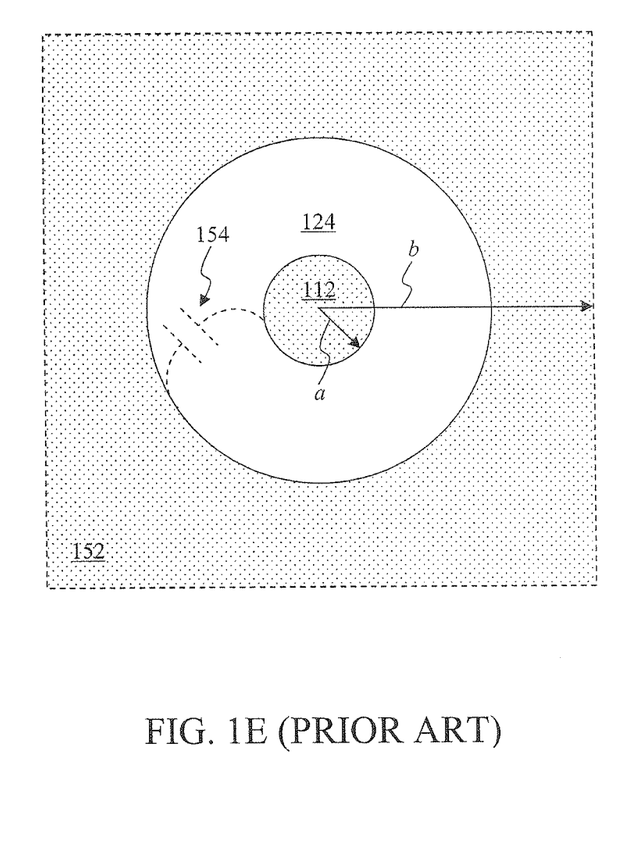
FIG. 1E illustrates a top view of one of the inner substrates used in the conventional multi-layer printed circuit board.

Performance of the Conventional Via Structure Used in the Conventional Multi-Layer PCB FIG. 1E illustrates a top view of one of the inner substrates used in the conventional multi-layer printed circuit board. More specifically, FIG. 1E illustrates a substrate 152 representing one of the substrates 104.1 through 104.$n$ having their respective conductive pathways arranged to form a plane such as a ground plane or a power plane to provide an example. As shown in FIG. 1E, the conventional via structure 110 forms a first conductor of a parasitic capacitor 154 and the conductive pathways of the substrate 152 form a second conductor of the parasitic capacitor 154. The capacitance of the parasitic capacitor 154 may be roughly approximated as:

$$C = \frac{2\pi\varepsilon}{\ln\left(\frac{b}{a}\right)}, \quad (1)$$

where C represents the capacitance of the parasitic capacitor 154, a represents a radial distance of the conventional via structure 110, b represents a radial distance of the conventional via structure 110 and the isolation region 124, and $\epsilon$ represents a permeability of the isolation region 124.

The impedance of the conventional via structure 110, namely the parasitic capacitor 154 and a parasitic inductance, effectively attenuate or reduce power levels of signals passing through the conventional via structure 110 as a function of frequency. The parasitic capacitor 154 additionally increases reflections of these signals back through the conductive pathway 108 and/or the conductive pathway 112. Therefore, reducing a parasitic capacitance of the parasitic capacitor 154 will effectively increase the power levels of the signals passing through the conventional via structure 110 as well as decreasing the reflections of these signals back through the conductive pathway 108 and/or the conductive pathway 112 at higher frequencies.

Figure 2A:
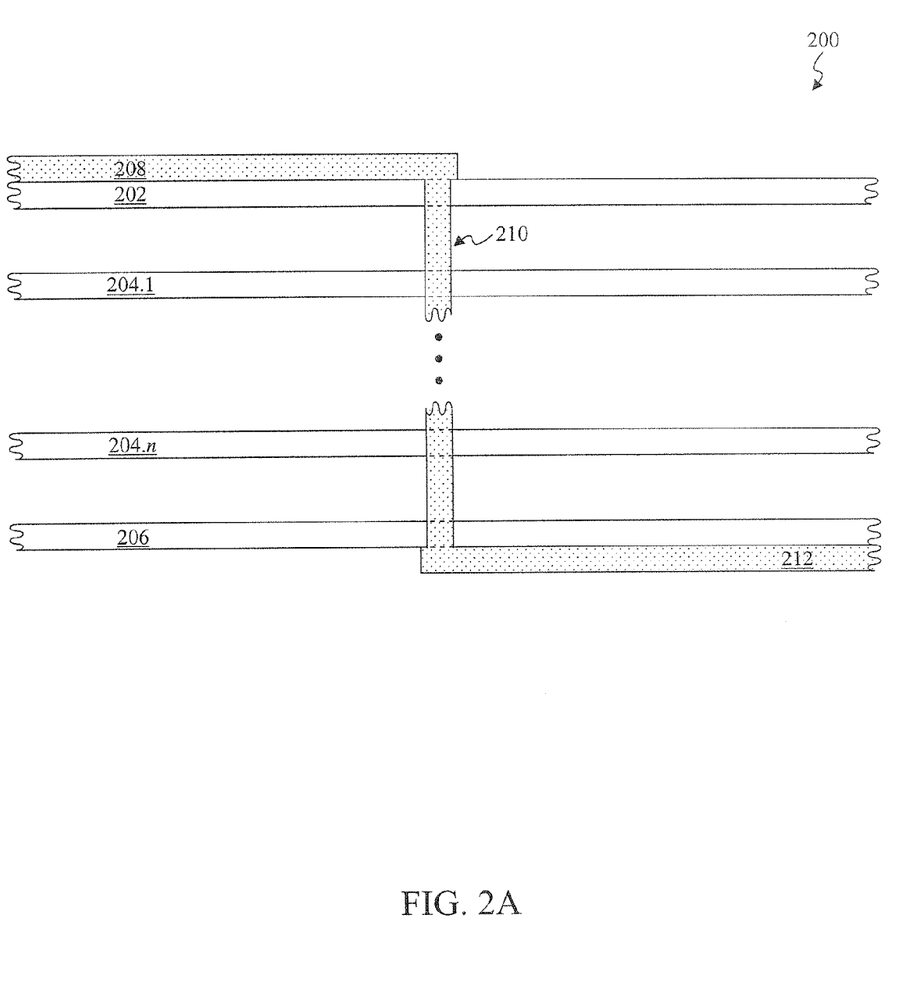
FIG. 2A illustrates a multi-layer printed circuit board according to an exemplary embodiment of the present invention.

Multi-Layer Printed Circuit Board According to an Exemplary Embodiment of the Present Invention FIG. 2A illustrates a multi-layer printed circuit board according to an exemplary embodiment of the present invention. A multi-layer PCB 200 includes one or more closed, or partially closed, geometric structures formed on inner substrates of the multi-layer PCB to enclose a via structure 210. Additionally, these one or more closed, or partially closed, gemortric struturce may be formed on outer substrates of the multi-layer PCB to enclose the via structure 210. These polygonal structures effectively reduce the parasitic capacitance of the via structure 210 to increase the power levels of the signals passing through the via structure 210 and to decrease the reflections of these signals back through a conductive pathway 208 and/or a conductive pathway 212.

Several substrates 202 through 206, each with their own conductive pathways, may be bonded together to form the multi-layer PCB 200. The multi-layer PCB 200 may include any number of substrates 204.1 through 204.n, also referred to as inner substrates, or it may not include any of the substrates 204.1 through 204.n. The conductive pathways formed onto one substrate may be connected to the conductive pathways formed onto other substrates using via structures. Holes are typically drilled from one substrate to another substrate then filled and/or plated with conductive material to form the via structure. For example, the conductive pathway 208 may be connected to the conductive pathway 212 by drilling a hole through the substrates 202 through 206 then plating the hole with copper, or any other suitable metal, to form a via structure 210. Via structures, commonly referred to as blind via structures, may alternatively be formed between an outer substrate, such as the substrate 202, and an inner substrate, such as one of the substrates 204.1 through 204.n. Alternatively, via structures, commonly referred to as buried via structures, may be formed between two inner substrates, such as any two of the substrates 204.1 through 204.n.

Figure 2B:
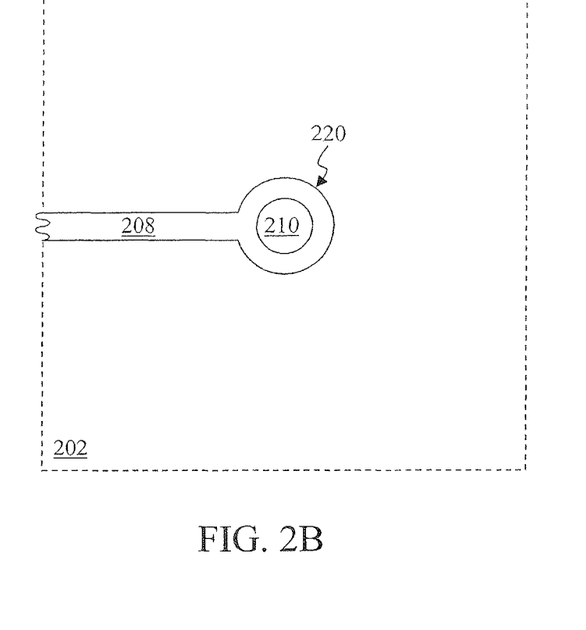
FIG. 2B illustrates a top view of a first outer substrate used in the multi-layer printed circuit board according to an exemplary embodiment of the present invention.

Via Structure Used in the Multi-Layer PCB According to an Exemplary Embodiment of the Present Invention FIG. 2B illustrates a top view of a first outer substrate used in the multi-layer printed circuit board according to an exemplary embodiment of the present invention. More specifically, FIG. 2B illustrates a portion of the substrate 202 having the conductive pathway 208. A hole is typically drilled from the substrate 202 to the substrate 206 then filled and/or plated with the conductive material to form the via structure 210. Typically, the drill used to form this hole is larger than a width of the conductive pathway 208. The conductive pathway 208 includes a circular ring of conductive material, referred to as a pad 220, to allow for safe drilling of the hole from the substrate 202 to the substrate 206. This configuration of the pad 220 is characterized by a radial distance that is greater than the hole that is drilled for the via structure 210.

Figure 2C:
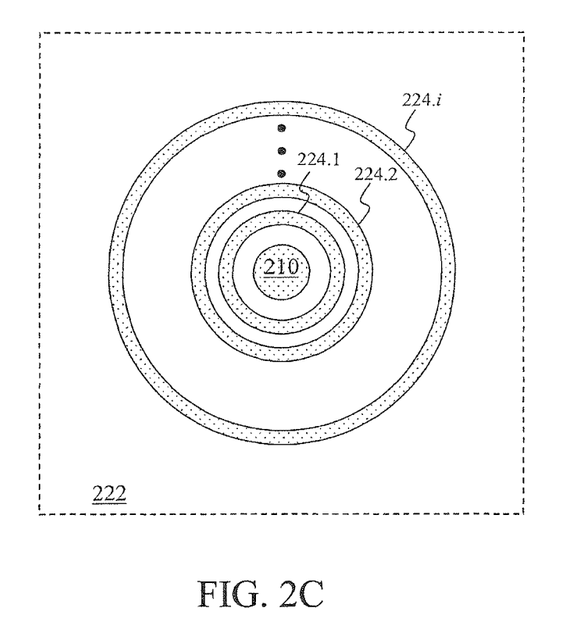
FIG. 2C illustrates a top view of an inner substrate used in the multi-layer printed circuit board according to an exemplary embodiment of the present invention.

FIG. 2C illustrates a top view of an inner substrate used in the multi-layer printed circuit board according to an exemplary embodiment of the present invention. More specifically, FIG. 2C illustrates a substrate 222 that represents a portion of one or more of the substrates 204.1 through 204.n. The substrate 222 includes the hole that is filled and/or plated to form the via structure 210. The substrate 222 may include one or more closed geometric structures 224.1 through 224.i that enclose the via structure 210. The one or more closed geometric structures 224.1 through 224.i is typically formed with conductive material. The outer most closed geometric structure, namely the closed geometric structure 224.i, may include the conductive pathways of the substrate 222.

Figure 2D:
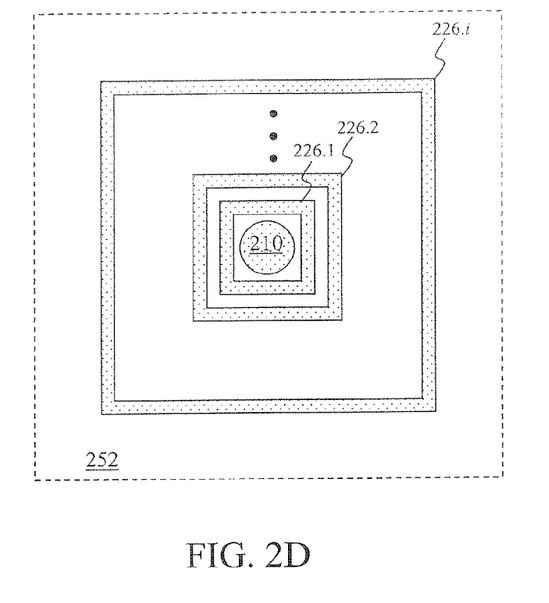
FIG. 2D illustrates a top view of an inner substrate used in the multi-layer printed circuit board according to a second exemplary embodiment of the present invention.
Figure 2E:
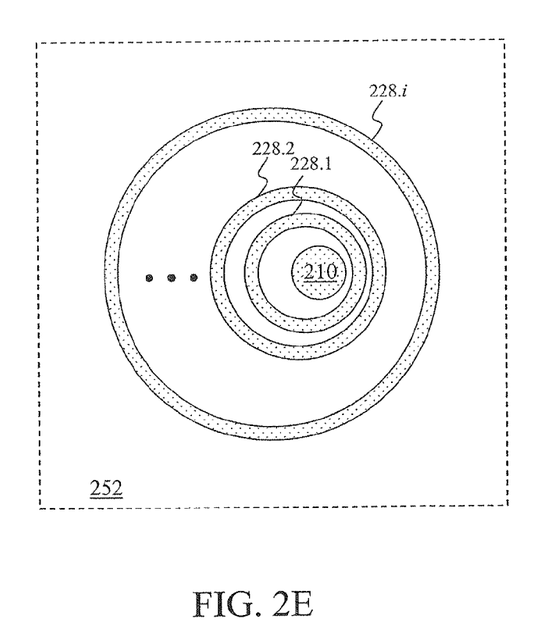
FIG. 2E illustrates a top view of an inner substrate used in the multi-layer printed circuit board according to third exemplary embodiment of the present invention.

Generally, the one or more closed geometric structures 224.1 through 224.i represents any closed, or partially closed, two-dimensional structure that is planar to the substrate 222 that encloses the via structure 210. In other words, the one or more closed geometric structures 224.1 through 224.i and the substrate 222 may reside on a single plane. For example, the one or more closed geometric structures 224.1 through 224.i may include one or more concentric circular rings as shown in FIG. 2C. Other structures are possible for the closed geometric structures 224.1 through 224.1, such as one or more concentric quadrilaterals 226.1 through 226.i as shown in FIG. 2D, one or more non-concentric circular rings 228.1 through 228.i as shown in FIG. 2E, one or more regular closed geometric structures, such as one or more regular polygons to provide an example, one or more irregular closed structures, such as one or more irregular polygons to provide an example, and/or any suitable combination of these closed structures that will be apparent to those skilled in the relevant art(s). The one or more closed geometric structures 224.1 through 224.i may be additionally characterized as being concentric geometric structures, non-concentric geometric structures, and/or any combination of concentric and non-concentric geometric structures.

Although FIG. 2C illustrates the top view of the inner substrate, those skilled in the relevant art(s) will recognize that the one or more closed geometric structures 224.1 through 224.i may be formed on either side, namely a top side or a bottom side, of the inner substrate without departing from the spirit and scope of the present invention. For example, the geometric structures 224.1 through 224.i may be formed only on the top side of the inner substrate, only on the bottom side of the inner substrate, or on both the top side and the bottom side of the inner substrate. It should also be noted that the one or more closed geometric structures 224.1 through 224.i may be foamed onto the substrate 202 and/or the substrate 206 on a side opposite to the conductive pathway 208 and the conductive pathway 212, respectively. For example, the one or more closed geometric structures 224.1 through 224.i may be formed onto a bottom side of the substrate 202 or a top side of the substrate 208.

Figure 2F:
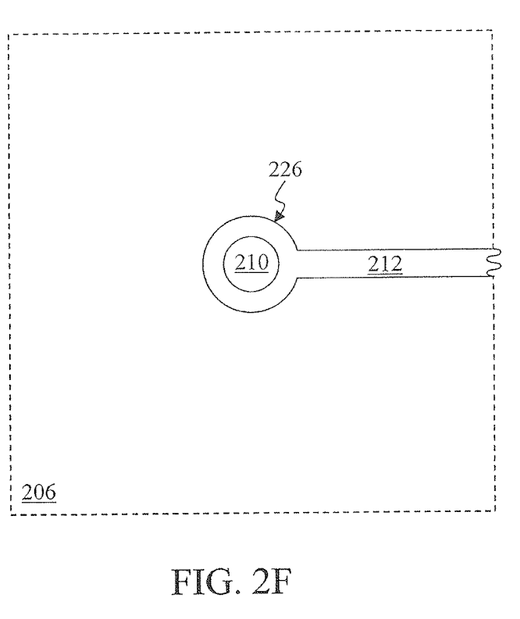
FIG. 2F illustrates a top view of a second outer substrate used in the multi-layer printed circuit board according to an exemplary embodiment of the present invention.

FIG. 2F illustrates a bottom view of a second outer substrate used in the multi-layer printed circuit board according to an exemplary embodiment of the present invention. More specifically, FIG. 2F illustrates a portion of the substrate 206 having the conductive pathway 212. A hole is typically drilled from the substrate 202 to the substrate 206 then filled and/or plated with the conductive material to form the via structure 210. Typically, the drill used to form this hole is larger than a width of the conductive pathway 212. The conductive pathway 212 includes a circular ring of conductive material, referred to as a pad 226, to allow for safe drilling of the hole from the substrate 202 to the substrate 206. This configuration of the pad 226 is characterized by a radial distance that is greater than the hole that is drilled for the via structure 210.

Although the pads 220 and 226 are illustrated and described as a circular ring of conductive material, those skilled in the relevant art(s) will recognize that the pads 220 and 226 may be any suitable closed geometric structure, such as a polygon to provide an example, without departing from the spirit and scope of the present invention.

It should be noted that one of the conductive pathway 208 or the conductive pathway 212 may be faulted on one or more of the substrates 204.1 through 204.n such that the via structure 210 represents the blind via. In this situation, the substrate 202 or the substrate 206 may include the one or more closed geometric structures 224.1 through 224.i. Additionally, both of the conductive pathway 208 and the conductive pathway 212 may be formed on one or more of the substrates 204.1 through 204.n such that the via structure 210 represents the burried via. In this situation, the substrate 202 and the substrate 206 may include the one or more closed geometric structures 224.1 through 224.i.

Figure 3A:
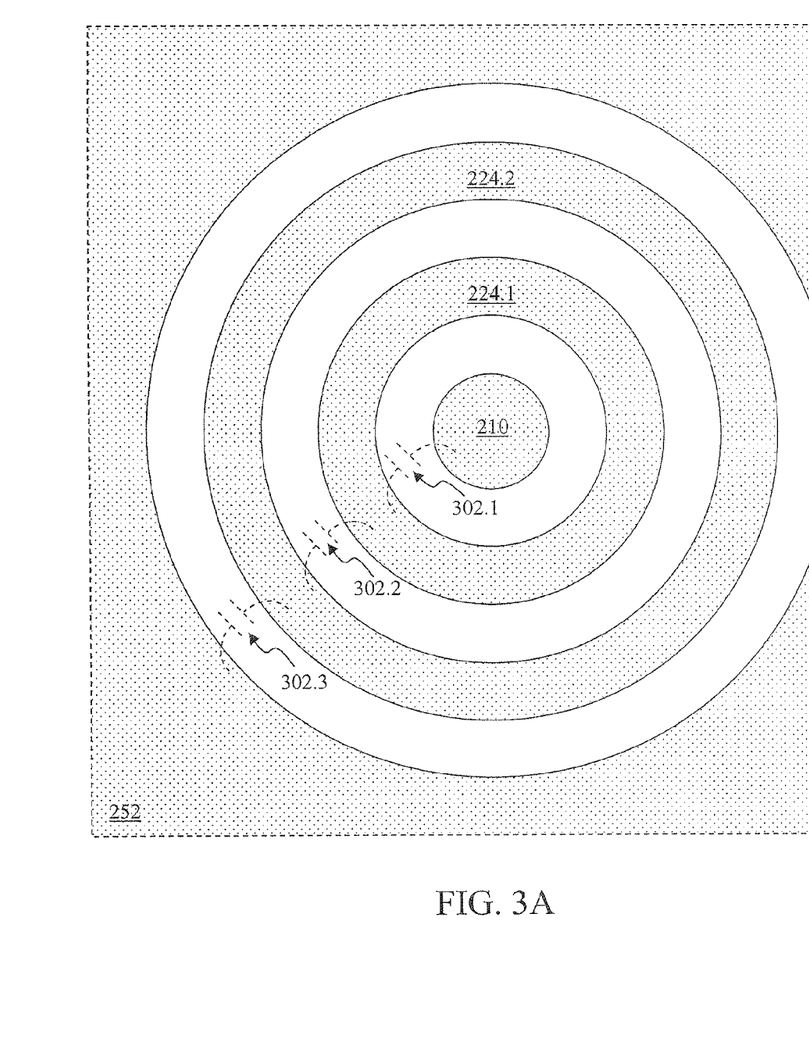
FIG. 3A illustrates a top view of one of the inner substrates used in the multi-layer printed circuit board according to an exemplary embodiment of the present invention.

Performance of the Via Structure Used in the Multi-Layer PCB According to an Exemplary Embodiment of the Present Invention FIG. 3A illustrates a top view of one of the inner substrates used in the multi-layer printed circuit board according to an exemplary embodiment of the present invention. More specifically, FIG. 3A illustrates a substrate 252 representing one of the substrates 204.1 through 204.n having their respective conductive pathways arranged to form a plane such as a ground plane or a power plane to provide an example. Generally, the closed geometric structure 224.1 through 224.i forms multiple capacitors connected in series from the via structure 210 to an outer most one of the closed geometric structure 224.1 through 224.i. As shown in FIG. 3A, the via structure 210 forms a first conductor of a first parasitic capacitor 302.1 and the closed geometric structure 224.1 forms a second conductor of the first parasitic capacitor 302.1. Likewise, the closed geometric structure 224.1 farms a first conductor of a second parasitic capacitor 302.2 and the closed geometric structure 224.2 forms a second conductor of the second parasitic capacitor 302.2. Similarly, the closed geometric structure 224.2 forms a first conductor of a third parasitic capacitor 302.3 and the conductive pathways of the substrate 252 form a second conductor of the third parasitic capacitor 302. However, this example for illustratively purposes only, those skilled in the relevant art(s) will recognize that the substrate 252 may have a greater or lesser number of geometric structures 302 configured and arranged differently, for example as described in FIG. 2C through 2E above, without departing from the spirit and scope of the present invention.

The first parasitic capacitor 302.1, the second parasitic capacitor 302.2, and the third parasitic capacitor 302.3 are arranged to form a series of capacitors. The equivalent capacitance of these parasitic capacitors may be approximated as:

$$C_{EQ} = \frac{1}{C_1} + \frac{1}{C_2} + \frac{1}{C_3}, \quad (2)$$

where $C_{EQ}$ represents the equivalent capacitance of the parasitic capacitors 302.1 through 302.3, $C_1$ represents the capacitance of the first parasitic capacitor 302.1, $C_2$ represents the capacitance of the second parasitic capacitor 302.2, and $C_3$ represents the capacitance of the third parasitic capacitor 302.3.

The equivalent capacitance $C_{EQ}$ of the via structure 210 is less than the capacitance of the conventional via structure 110. As a result, the via structure 210 effectively increases the power levels of the signals passing through the via structure 210 as well as decreasing the reflections of these signals back through the conductive pathway 208 and/or the conductive pathway 212 at higher frequencies. Scattering parameters, commonly referred to as S-parameters, describe the electrical behavior of electrical networks when undergoing various steady state stimuli by electrical signals. The S-parameters of electrical networks, such as the via structure 210 and the conventional via structure 110, may be measured and/or simulated to determine power levels of signals passing through the electrical networks, commonly referred to as S21, and/or the reflections of these signals back through the electrical networks, commonly referred to as S11.

Figure 3B:
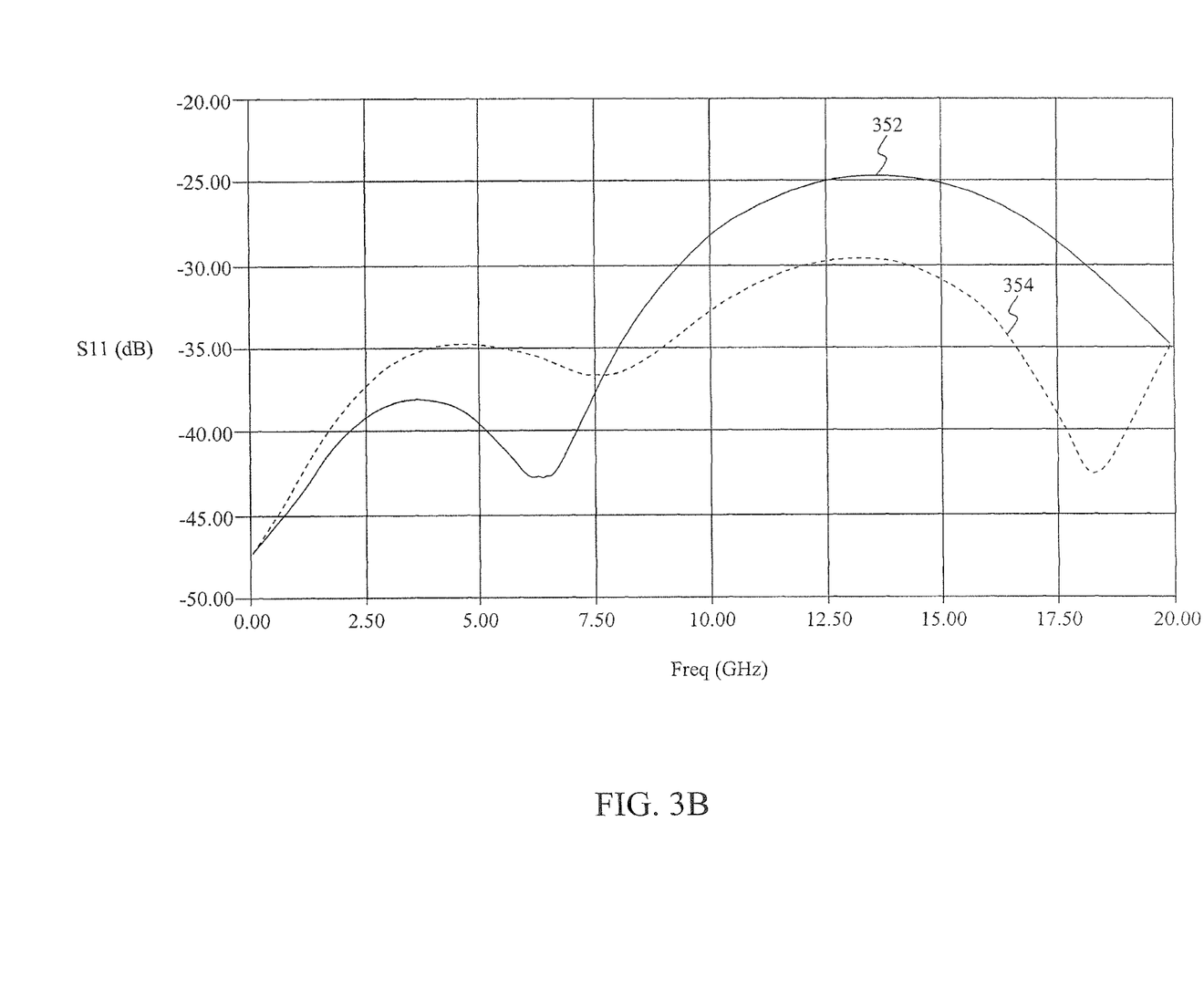
FIG. 3B illustrates a comparison of a first scattering parameter of the conventional via structure and the via structure according to an exemplary embodiment of the present invention.

FIG. 3B illustrates a comparison of a first scattering parameter of the conventional via structure and the via structure according to an exemplary embodiment of the present invention. More specifically, FIG. 3B illustrates a comparison of the reflection scattering parameter S11 between the conventional via structure 110 and the via structure 210. The reflection scattering parameter S11 represents a ratio, usually measured in decibels (dB), of between energy entering the via structure from a conductive pathway to energy leaving the via structure from the conductive pathway. Therefore, a larger scattering parameter S11 for a given frequency represents more energy being reflected by the via structure when compared to a smaller scattering parameter S11 for the given frequency. As shown in FIG. 3B, the reflection scattering parameter S11 for the conventional via structure 110, denoted as scattering parameter 352, is smaller than the reflection scattering parameter S11 for the via structure 210, denoted as scattering parameter 354, from approximate zero Hertz (Hz) to about approximately 7.7 Gigahertz (GHz). The conventional via structure 110 reflects less energy than the via structure 210 at these frequencies. However, the scattering parameter 352 is larger than the scattering parameter 354 at frequencies greater than approximately 7.7 GHz. The conventional via structure 110 reflects more energy than the via structure 210 at these frequencies.

Figure 3C:
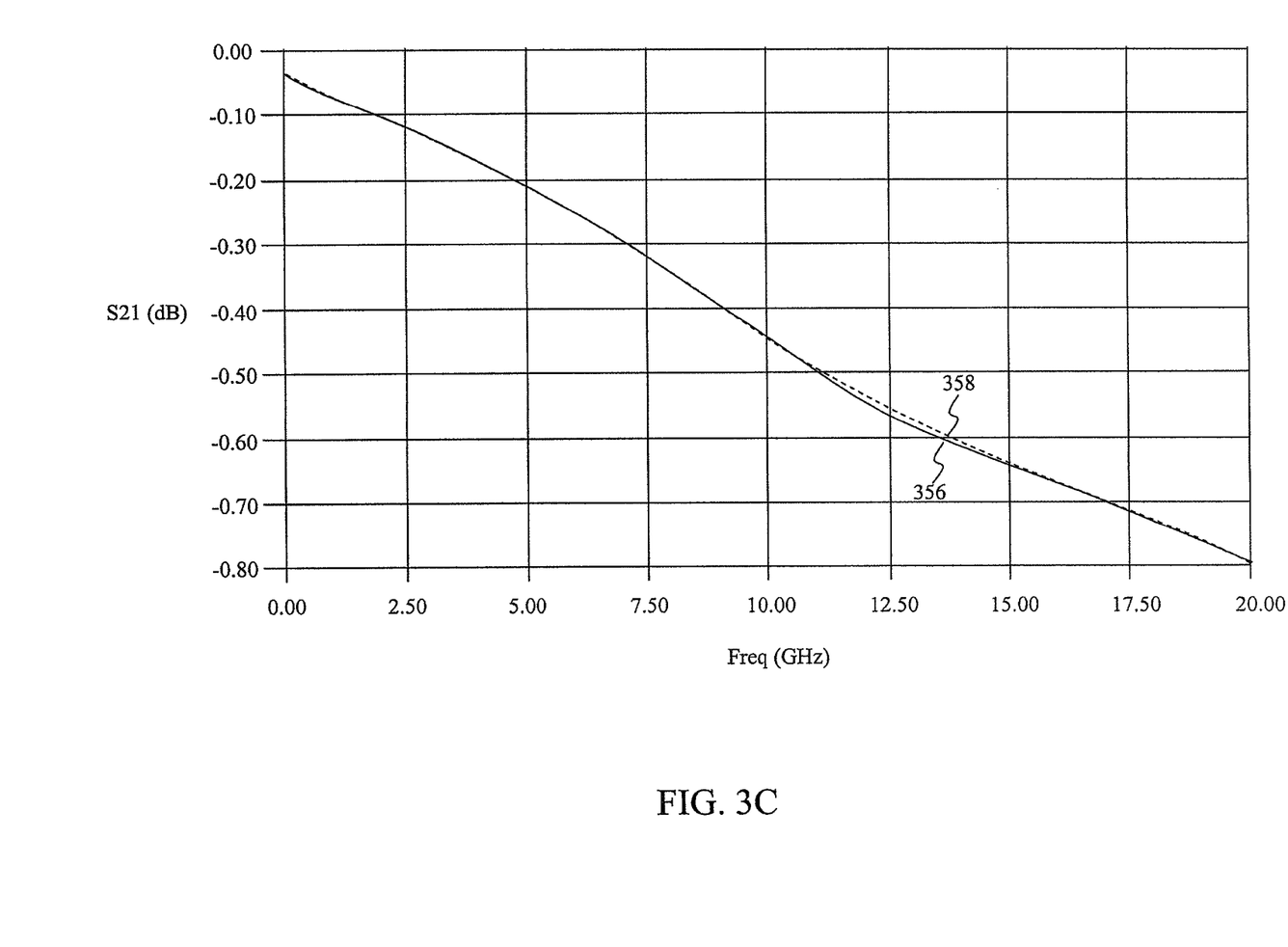
FIG. 3C illustrates a comparison of a second scattering parameter of the conventional via structure and the via structure according to an exemplary embodiment of the present invention.

FIG. 3C illustrates a comparison of a second scattering parameter of the conventional via structure and the via structure according to an exemplary embodiment of the present invention. More specifically, FIG. 3C illustrates a comparison of the transmission scattering parameter S21 between the conventional via structure 110 and the via structure 210. The transmission scattering parameter S21 represents a ratio, usually measured in decibels (dB), of between energy entering the via structure from a first conductive pathway to energy leaving the via structure from a second conductive pathway. Therefore, a larger scattering parameter S21 for a given frequency represents more energy passing through the via structure when compared to a smaller scattering parameter S21 for the given frequency.

As shown in FIG. 3C, the transmission scattering parameter S21 for the conventional via structure 110, denoted as scattering parameter 356, is approximately equal to the transmission scattering parameter S21 for the via structure 210, denoted as scattering parameter 358. However, from about approximately 10.25 GHz to about approximately 16.50 Gigahertz, the scattering parameter 358 is greater than the scattering parameter 356. The via structure 210 passes more energy than the conventional via structure 110 reflects more energy than the conventional via structure 110 at these frequencies.

Figure 4:
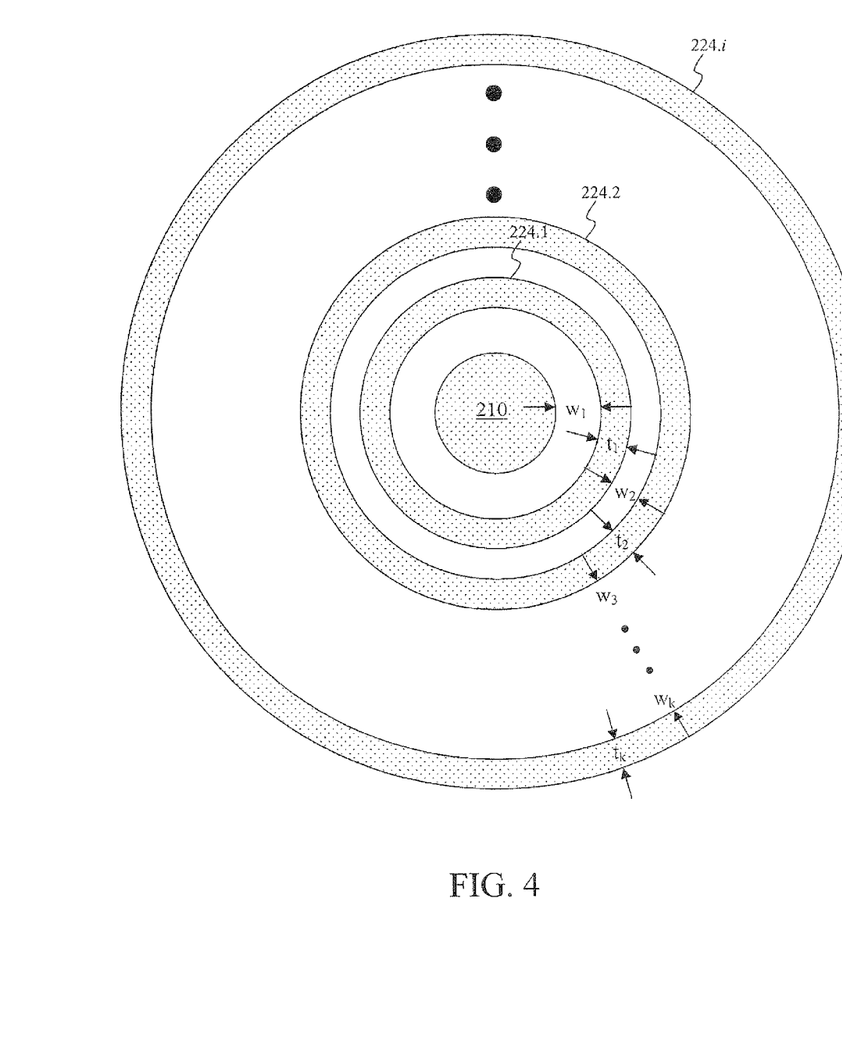
FIG. 4 illustrates design parameters of the via structure used by electronic design automation software for designing of the multi-layer printed circuit board according to an exemplary embodiment of the present invention.

Electronic Design Automation (EDA) Software Implementation of the Via Structure Used in the Multi-Layer PCB According to an Exemplary Embodiment of the Present Invention FIG. 4 illustrates design parameters of the via structure used by electronic design automation software for designing of the multi-layer printed circuit board according to an exemplary embodiment of the present invention. More specifically, FIG. 4 illustrates the via structure 210 and the one or more closed geometric structures 224.1 through 224.i of one of the substrates such as one of the substrates 204.1 through 204.n to provide an example. Each of the one or more closed geometric structures 224.1 through 224.i may be characterized by a corresponding width $w_1$ through $w_k$ and a thickness $t_1$ through $t_k$.

The widths $w_1$ through $w_k$ represent a region between from the via structure 210 to a first one of the closed geometric structures 224.1 through 224.i and/or or between any two adjacent closed geometric structures 224.1 through 224.i that is free of conductive material. This region may include non-conductive material similar to the substrates, epoxy resin prepreg, and/or any other suitable non-conductive material that will be apparent to those skilled in the relevant art(s). The widths $w_1$ through $w_k$ may be similar for each of the closed geometric structures 224.1 through 224.i or may vary between any two of the closed geometric structures 224.1 through 224.i.

The thickness $t_1$ through $t_k$ represent a thickness or width of the closed geometric structures 224.1 through 224.i. Each of the closed geometric structures 224.1 through 224.i may be characterized as having a uniform thickness, as shown in FIG. 4, or a non-uniform or varying thickness. The thickness $t_1$ through $t_k$ may be similar for each of the closed geometric structures 224.1 through 224.i or may vary between any two of the closed geometric structures 224.1 through 224.i.

The widths $w_1$ through $w_k$ and the thickness $t_1$ through $t_k$ represent design parameters to be used by an Electronic Design Automation (EDA) software. EDA software is a category of computer aided design tools for designing, simulating, and/or producing electronic systems such as PCBs. The EDA software may select among various widths $w_1$ through $w_k$ and the thickness $t_1$ through $t_k$ to achieve a optimized set of design parameters, such as the scattering parameters as discussed above. The EDA software may adjust each of the widths $w_1$ through $w_k$ and the thickness $t_1$ through $t_k$ using a binary search and/or any other suitable search that will be apparent to those skilled in the relevant art(s) to achieve optimal widths $w_1$ through $w_k$ and optimal thickness $t_1$ through $t_k$ for the closed geometric structures 224.1 through 224.i.

CONCLUSION

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus, the present invention should not be limited by any of the above-described exemplary embodiments, but should be defined only in accordance with the following claims and their equivalents.

What is claimed is:

1. A multi-layer printed circuit board (PCB), comprising:
    a first conductive pathway formed onto a first substrate;
    a second conductive pathway formed onto a second substrate;
    a via structure formed through a third substrate to connect the first conductive pathway to the second conductive pathway;
    a first closed geometric structure formed onto a surface of the third substrate to enclose the via structure, wherein the first closed geometric structure is electrically isolated from the via structure; and
    a second closed geometric structure formed onto the surface of the third substrate to enclose the first closed geometric structure, wherein the second closed geometric structure is electrically isolated from the first closed geometric structure, wherein the second closed geometric structure is characterized by a first width and a first thickness, wherein the first width represents a first region from the first closed geometric structure in the third substrate that is free of conductive material, and wherein the first thickness represents a thickness of the second closed geometric structure.

2. The multi-layer PCB of claim 1, wherein the first closed geometric structure comprises:
    a regular polygon.

3. The multi-layer PCB of claim 1, wherein the first closed geometric structure comprises:
    a circular ring.

4. The multi-layer PCB of claim 1,
    wherein the first closed geometric structure is characterized by a second width and a second thickness,
    wherein the second width represents a second region in the third substrate that is free of conductive material, and
    wherein the second thickness represents a thickness of the first closed geometric structure.

5. The multi-layer PCB of claim 4, wherein the second width and the second thickness represent design parameters to be used by electronic design automation (EDA) software.

6. The multi-layer PCB of claim 1, wherein the first closed geometric structure comprises:
    a regular polygon.

7. The multi-layer PCB of claim 1, wherein the third substrate is positioned between the first substrate and the second substrate.

8. A multi-layer printed circuit board (PCB), comprising:
    a first conductive pathway formed onto a first substrate;
    a second conductive pathway formed onto a second substrate;
    a via structure formed through a third substrate to connect the first conductive pathway to the second conductive pathway; and
    a plurality of closed geometric structures formed onto a surface of the third substrate, wherein the closed geometric structures form a plurality of capacitors, the capacitors being arranged in series from the via structure to an outer most one of the closed geometric structures, wherein the capacitors comprise:
- a first capacitor formed by a first closed geometric structure formed onto the surface of the third substrate to enclose the via structure and a second closed geometric structure formed onto the surface of the third substrate to enclose the first closed geometric structure, wherein the second closed geometric structure is electrically isolated from the first closed geometric structure, and
- a second capacitor formed by the first closed geometric structure and a third closed geometric structure formed onto the surface of the third substrate, wherein the third closed geometric structure is formed around the second closed geometric structure, and wherein the third closed geometric structure is electrically isolated from the first closed geometric structure and the second closed geometric structure.

9. The multi-layer PCB of claim 8, wherein the via structure forms a first conductor of the first capacitor, and wherein the first closed geometric structure forms a second conductor of the first capacitor.

10. The multi-layer PCB of claim 9, wherein the first closed geometric structure forms a first conductor of the second capacitor, and wherein the second closed geometric structure forms a second conductor of the second capacitor.

11. The multi-layer PCB of claim 8, wherein the closed geometric structures comprise regular polygons.

12. The multi-layer PCB of claim 8, wherein the closed geometric structures comprise regular circular rings.

13. The multi-layer PCB of claim 8, wherein the closed geometric structures comprise concentric circular rings.

14. The multi-layer PCB of claim 8, wherein the third substrate is positioned between the first substrate and the second substrate.

15. A multi-layer printed circuit board (PCB), comprising:
- a first conductive pathway formed onto a first substrate;
- a second conductive pathway formed onto a second substrate;
- a via structure formed through a third substrate to connect the first conductive pathway to the second conductive pathway; and
- a plurality of closed geometric structures formed onto a surface of the third substrate, wherein the plurality of closed geometric structures form one or more capacitors, the one or more capacitors being arranged in series from the via structure to an outer most one of the plurality of closed geometric structures, and wherein the plurality of closed geometric structures comprise:
  - a first closed geometric structure formed onto the surface of the third substrate to enclose the via structure,
  - a second closed geometric structure formed onto the surface of the third substrate to enclose the first closed geometric structure, wherein the second closed geometric structure is electrically isolated from the first closed geometric structure, and
  - a third closed geometric structure formed onto the surface of the third substrate, wherein the third closed geometric structure is formed around the second closed geometric structure, and wherein the third closed geometric structure is electrically isolated from the first closed geometric structure and the second closed geometric structure.

16. The multi-layer PCB of claim 15, wherein the one or more capacitors comprise:
- a first capacitor, the via structure forming a first conductor of the first capacitor and the first closed geometric structure forming a second conductor of the first capacitor.

17. The multi-layer PCB of claim 15,
wherein the first closed geometric structure is characterized by a width and a thickness,
wherein the width represents a region in the third substrate that is free of conductive material, and
wherein the thickness represents a thickness of the first closed geometric structure.

* * * * *